United States Patent [19]
Osada et al.

[11] Patent Number: 4,748,646
[45] Date of Patent: May 31, 1988

[54] X-RAY LITHOGRAPHY SYSTEM

[75] Inventors: Toshihiko Osada, Ebina; Ichiro Honjo, Ibaraki; Kenji Sugishima, Kawasaki, all of Japan

[73] Assignee: Fujitsu Limited, Kawasaki, Japan

[21] Appl. No.: 27,553

[22] Filed: Mar. 18, 1987

[30] Foreign Application Priority Data

Mar. 18, 1986 [JP] Japan .................................. 61-58055

[51] Int. Cl.[4] .......................... G21K 5/00; G21K 5/10
[52] U.S. Cl. ...................................... 378/34; 378/119; 378/146
[58] Field of Search ........................ 378/34–35, 378/146, 161, 119

[56] References Cited

U.S. PATENT DOCUMENTS 4,516,254  5/1985  Komeyama et al. .................. 378/35

OTHER PUBLICATIONS

"Application of Synchrotron Radiation to X-ray Lithography" by Spiller et al. JAP, vol. 47, No. 12, 12/1976, pp. 5450-5459.
J. Vac. Sci. Technol. B 1(4), Oct.-Dec. 1983, pp. 1262-1266.

*Primary Examiner*—Carolyn E. Fields
*Assistant Examiner*—John C. Freeman
*Attorney, Agent, or Firm*—Staas & Halsey

[57] ABSTRACT

An X-ray lithography system, in which an X-ray beam is separated from synchrotron radiation beams and reflected by a scanning mirror which vertically scans the reflected X-ray beam. The X-ray is irradiated into an exposure chamber via a beryllium window, which is vertically oscillated in such a manner that the beryllium window is shifted up and down in synchronization with the scanning operation of the X-ray beam.

4 Claims, 6 Drawing Sheets

Fig. 2
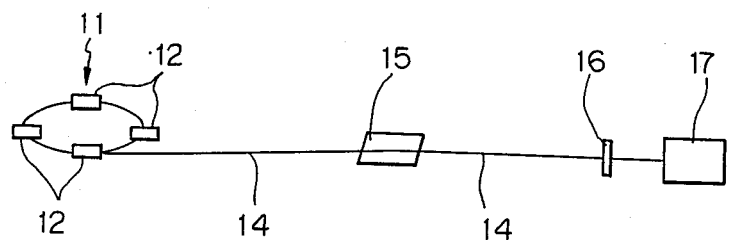
Fig. 4A        Fig. 4B
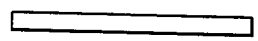    

X-RAY LITHOGRAPHY SYSTEM

BACKGROUND OF THE INVENTION

1. Field of the Invention

This invention relates to an X-ray exposure system, and more particularly, to an X-ray lithography system in which X-rays from a synchrotron radiation source are irradiated through a beryllium window onto the masked semiconductor wafer.

2. Description of the Related Art

In a lithography system, a semiconductor wafer or chip coated with a resist is exposed to beam radiation. Recently, in such lithographic radiation, an X-ray beam taken from synchrotron radiation has been used, in which X-rays from a synchrotron radiation source are irradiated through a beryllium window onto a masked semiconductor wafer, as disclosed in J. Vac. Sci. Technol. B 1(4), Oct.-Dec. 1983, pages 1262-1266.

The beryllium window is installed between a vacuum chamber for transmitting the X-ray beam and an atmospheric exposure chamber for accommodating wafers, and therefore, is subjected to a pressure, as will be mentioned hereinafter in detail. The beryllium window must, therefore, have sufficient mechanical strength to withstand a pressure, but on the other hand, if the thickness of the beryllium window could be reduced, the intensity of the X-ray beam transmitted therethrough would be increased, as also mentioned hereinafter in detail. Therefore, it would be advantageous if the thickness of the beryllium window were reduced.

SUMMARY OF THE INVENTION

An object of the present invention is to provide an X-ray lithography system using synchrotron radiation, capable of overcoming the drawbacks mentioned above with reference to the related art.

Another object of the present invention is to provide an X-ray lithography system using synchrotron radiation, wherein the thickness of a beryllium window is reduced, but X-ray exposure on a large-sized wafer is ensured.

According to the present invention, there is provided an X-ray lithography system comprising: an X-ray generation source including means for separating an X-ray beam from synchrotron radiation beams; a vacuum chamber for defining a passage of the X-ray beam; a scanning mirror arranged in one section of the vacuum chamber for reflecting the X-ray beam; means for oscillating the scanning mirror so as to vertically scan the reflected X-ray beam; a beryllium window defined as a part of the vacuum chamber, through which the X-ray beam is irradiated into an exposure chamber in which is arranged a work to be exposed to the X-ray radiation; and, means for vertically oscillating the beryllium window in such a manner that the beryllium window is shifted up and down in synchronization with the scanning operation of the X-ray beam at a position of the beryllium window.

In a preferred embodiment of this invention, the beryllium window is relatively wide in the horizontal direction, but narrow in the vertical direction, for example, a size of 50 mm × 5 mm, and the thickness thereof is relatively thin, for example, 10 μm.

According to the present invention, it is possible to increase the intensity of an X-ray beam transmitted through the beryllium window, since a beryllium window having a relatively thin thickness can be used and, therefore, any decrement or loss of the X-ray beam is relatively small, compared to a beryllium window in a conventionally known X-ray lithography system. Further, due to the scanning operation of the X-ray beam, a wide exposure area can be maintained.

BRIEF DESCRIPTION OF THE DRAWINGS

FIG. 2 schematically illustrates an exposure system using a synchrotron radiation beam;

FIGS. 4A and 4B illustrate the horizontal and vertical distributions of the X-ray beam, respectively;

DESCRIPTION OF THE PREFERRED EMBODIMENTS

Figure 1:
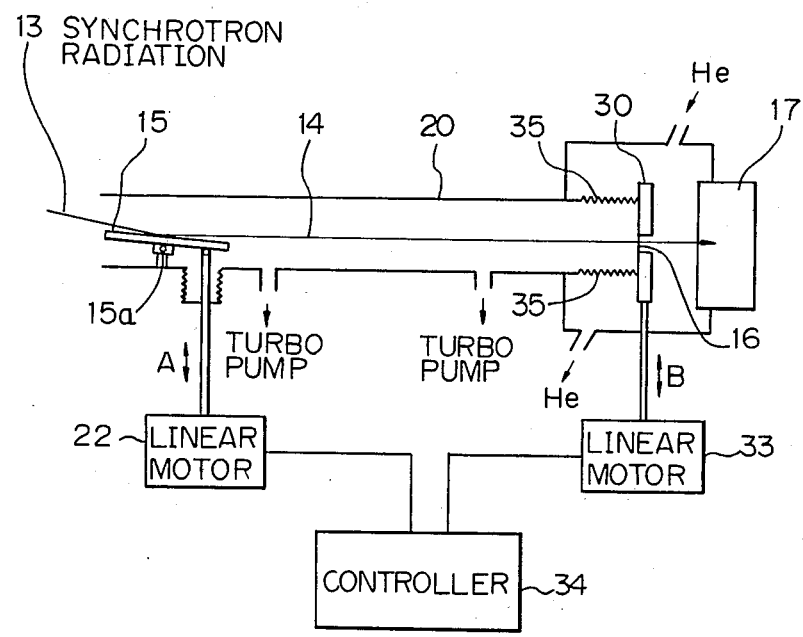
FIG. 1 is an illustration of an embodiment of an X-ray lithography system according to the present invention.

Prior to the explanation of an embodiment of this invention, a principle of synchrotron radiation will be briefly described. Synchrotron radiation beams can be obtained by bending the travelling direction of a highly energized electron with the help of a magnetic field. That is, an electron which is accelerated by a storage ring is supplied to a magnetic field of a magnet. The electron travels around the magnetic field formed by the magnet for a life of, for example, two to ten hours, so that a wide range of beams, fram ultrared-beam to an X-ray, can be obtained due to the effects of relativity, and emitted in the tangential direction. The beam thus obtained depends on the intensity of the magnetic field and the photon energy. In an X-ray lithography system, only X-rays are separated from the beams thus obtained, and used.

FIG. 2 schematically illustrates an exposure system using a synchrotron radiation beam. In an X-ray generation source 11, an electron (e−) travels along a circular orbit having a diameter of, for example, 10 m. Several coil magnets 12 each having a U-shaped cross-section are arranged along the path of this circular orbit, so that path of the electron (e−) is diverted when the electron passes through the magnetic field of the magnets 12, and a radiation beam is irradiated in the tangential direction. The thus separated X-rays 14 are reflected at a mirror 15 and introduced into an exposure chamber 17 via a window 16 made of a beryllium having a high X-ray transmission property.

Figure 3:
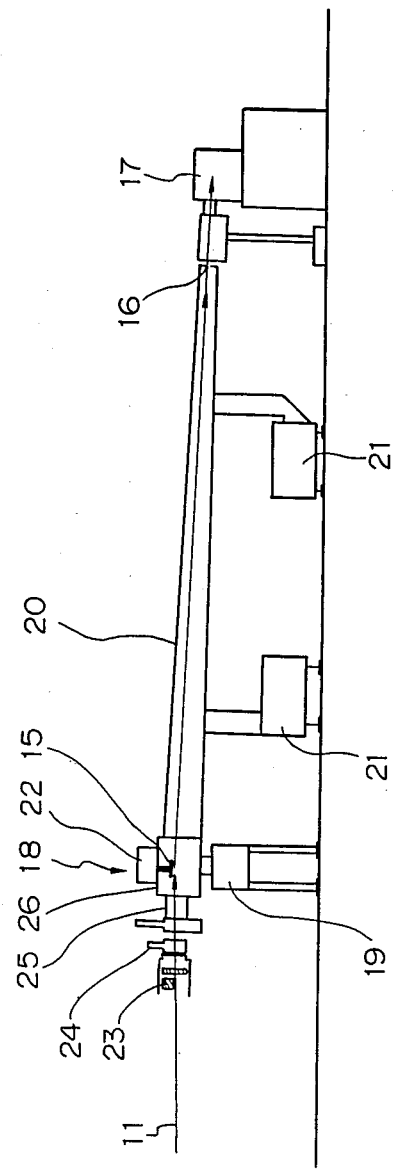
FIG. 3 is an illustration of a conventional X-ray exposure system.

FIG. 3 (Prior Art) is an illustration of a conventionally known X-ray exposure system, such as disclosed in J. Vac. Sci. Technol. B 1(4), Oct.-Dec. 1983, pages 1262-1266. In this system, the X-ray generation source 11 is kept in a vacuum at about $10^{-9}$ Torr, and a chamber 18 in which a scanning mirror 15 is arranged is kept in an ultrahigh vacuum at about $10^{-10}$ Torr. The surface of the mirror 15 is made of quartz or silicone carbide and finished to a roughness (smoothness) of 0.02 μm. The pressure in the mirror chamber 18 is reduced to maintain the vacuum, as mentioned above, by an ion pump 19. Such an ultrahigh vacuum serves to prevent any substances from existing in the mirror chamber 18; since if such substances existed in the chamber 18, they would be adhered to the mirror surface by the X-rays. The distance from the X-ray generation source 11 to the mirror chamber 18 is about 3 m, and the distance from the mirror chamber 18 to the beryllium window 16 is about 7 m. The chamber section 20 within this distance of 7 m is kept in a vacuum at about $10^{-6}$ Torr by a plurality of turbine pumps 21. The scanning mirror 15 is inclined by 1° with respect to the horizontal plane and driven by a linear motor (not shown in FIG. 3) located outside the chamber 18 and coupled to the mirror 15, so that the mirror 15 is oscillated by ±3 milliradian about a horizontal axis to perform a vertical scanning of the X-ray beam. In FIG. 3, 23 denotes a beam shutter; 24, a vacuum valve; 25, a flat tunnel; and 26, a mirror box.

The X-ray beam thus obtained has a wide and regular distribution in the horizontal direction, but only a narrow distribution in the vertical direction, as shown in FIGS. 4A and 4B.

Figure 5:
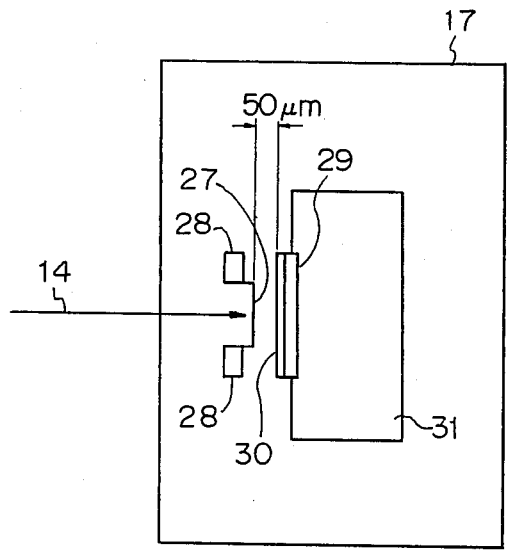
FIG. 5 schematically illustrates the arrangement of the mask and a semiconductor wafer.
Figure 6:
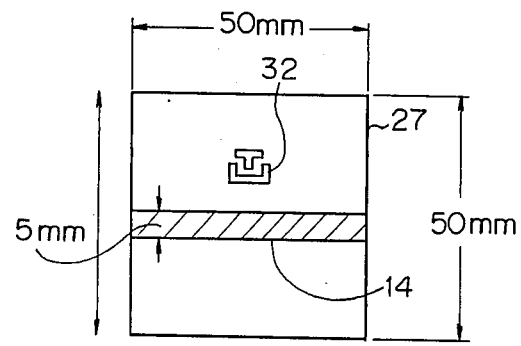
FIG. 6 is a front view of a mask having a size of 5 cm × 5 cm.

FIG. 5 schematically illustrates the arrangement of a mask and a semiconductor wafer, in which 27 denotes a mask; 28, a mask holder; 29, a semiconductor wafer; 30, a resist coated on the surface of the wafer 29; and 31, a stage for mounting the wafer 29 thereon. FIG. 6 is a front view of the mask 27 having a size of 5 cm ×5 cm square and provided with a pattern 32 (only a part thereof being schematically illustrated in FIG. 6). An X-ray beam having a horizontally wide but vertically short cross-section is scanned vertically on the mask 27, as shown by an arrow, while the mirror oscillates as mentioned above.

Figure 9:
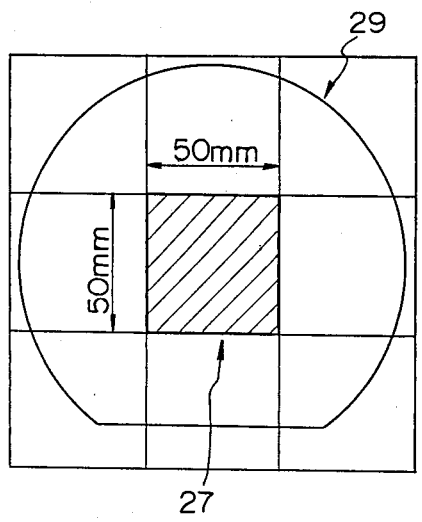

Generally speaking, large sized wafers have been recently more and more in demand. Therefore, the size of the wafer must be increased accordingly, for example, from 6 inches (150 mm) to 8 inches (200 mm) in diameter. On the other hand, the verticla distribution of the X-ray beam has remained samll, for example, 5 mm. Therefore, a plurality of shots, each having an exposure area of 5 cm ×5 cm due to the scanning limit of the mirror 15 (FIG. 3), as mentioned above, are necessary to ensure an exposure over all of the surface of the wafer 29. Therefore, the wafer 29 is mounted on the stage 31 and moved therewith at every shot by a so-called stop-and-repeat system, so that all of the surface of the wafer 29 is exposed to the X-ray beam by a plurality of shots, for example, nine shots, as seen in FIG. 9. That is, a single section, 5 cm×5 cm, of the surface of the wafer 29 is exposed at each shot by the scanning operation of the X-ray beam, and then the wafer 29 is moved so that the next section can be exposed, and finally, all of the surface of the wafer 29 is covered by, for example, nine shots.

In the above-mentioned X-ray exposure system, the exposure chamber 17 is kept at almost atmospheric pressure (760 Torr) to facilitate the insertion and removal of wafers at the chamber 17. In addition, the gap between the mask 27 and the wafer 29 is about 50 μm. The wavelength of the beam suitable for X-ray lithography is 7Å±2Å. If the wavelength of the X-ray beam is too long, the pattern exposed on the resist 30 will be dimmed by the Fresnel effects. On the other hand, if the wavelength of the X-ray beam is too short, such as 1Å, secondary electrons would be generated to also cause a dimming of the pattern exposed on the resist 30, since the X-ray energy will be far too high.

Therefore, the X-ray beam in the range of 7Å±2Å wavelength should be used. According to experiments conducted by the inventors, the relationship between the wavelength of the X-ray beam, the thickness of the beryllium window 16, and the intensity of the X-ray beam was found to be as shown in the following Table.

TABLE

| Wavelength of X-ray | Thickness of Beryllium Window | Intensity of X-ray |
| --- | --- | --- |
| 9 Å | 25 μm | ~0 |
| 7 Å | " | ½ |
| 4 Å | " | 9/10 |

Figure 7:
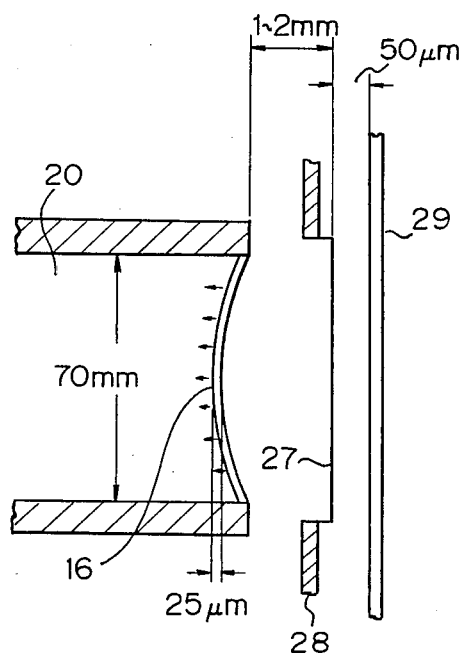
FIG. 7 illustrates an arrangement of a beryllium window, a mask, and a wafer in a conventional X-ray exposure system as shown in FIG. 3.

FIG. 7 (Prior Art) illustrates an arrangement of the beryllium window 16, the mask 27, and the wafer 19 in which the distance between the beryllium window 16 and the mask 27 is 1 mm ~2 mm, and the gap between the mask 27 and the wafer 29 is about 50 μm, as mentioned above. The thickness of the beryllium window 16 is generally about 25 μm ~50 μm and the diameter thereof is about 70 mm. The chamber 20 is kept at a vacuum of $10^{-6}$ Torr but, on the other hand, the mask 27 is installed in an atmospheric environment. Thus, the beryllium window 16 is subjected to a pressure as shown by arrows and, therefore, must have sufficient mechanical strength to endure the pressure exerted thereon. On the other hand, if the thickness of the beryllium window could be reduced, for example, from 25 μm as in the conventional system to 10 μm, the intensity of the X-ray beam transmitted by the beryllium window 16 would be increased 2.5 times. Therefore, it would be advantageous to reduce the thickness of the beryllium window.

FIG. 1 is an illustration of an embodiment of an X-ray exposure system according to the present invention. As shown in FIG. 1, an X-ray beam 14 transmitted from an X-ray generation source, i.e., the storage ring 11 (FIG. 3), is transmitted through the vacuum chamber 20 by the scanning mirror 15, which is inclined by 1° with respect to the horizontal plane, to a beryllium window 16.

Figure 8A:
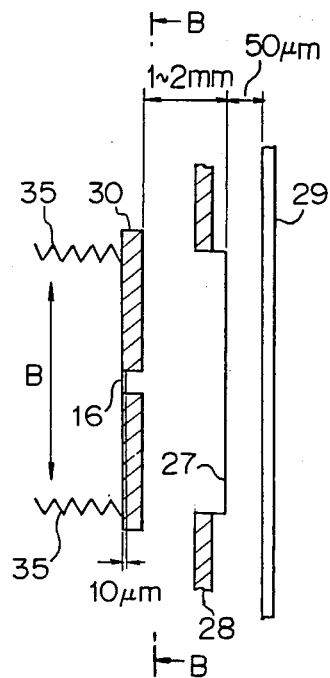
FIG. 8A illustrates an arrangement of a beryllium window, a mask, and a wafer in an X-ray exposure system according to this invention as shown in FIG. 1.
Figure 8B:
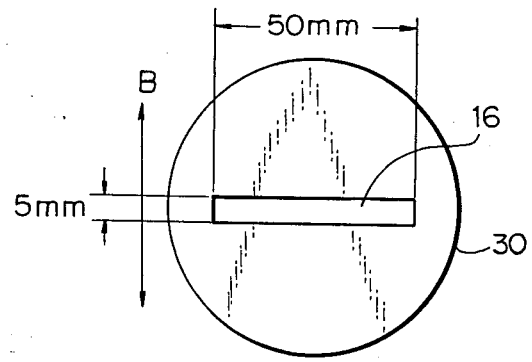
FIG. 8B is a front view of the beryllium window taken along the line B—B in FIG. 8A; and, FIG. 9 illustrates a plurality of X-ray exposure shots formed on a wafer by a stop-and-repeat process.

According to the present invention, the beryllium window 16 has a thickness of 10 μm and a size of 5 mm (vertical)×50 mm (horizontal), as seen in FIGS. 8 and 9. The beryllium window 16 is defined in a window holder 30 attached to an end of a flexible bellows portion 35 of the vacuum chamber 20 and defining an end wall of the vacuum chamber 20. The window holder 30 is coupled to a linear motor 33 in such a manner that the beryllium window 16 oscillates vertically as shown by an arrow B. The bellows portion 35 ensures the vertical oscillation of the window holder 30.

On the other hand, the scanning mirror 15 is coupled to and driven by a linear motor 22, located outside the mirror chamber 18, so that the mirror 15 is oscillated as shown by an arrow A by ±3 milliradian about a horizontal axis 15a to perform a vertical scanning of the X-ray beam, in the same manner as in the system shown in FIG. 3.

The linear motor 33 as well as the linear motor 22 are electrically connected to a controller 34, respectively, so that the linear motors 22 and 33 are controlled to operate synchronous with respect to each other, in such a manner that the beryllium window 16 is reciprocally shifted up and down in synchronization with the scanning operation of the X-ray beam 14, to cover the area of a single section, 5 cm×5 cm, with one shot. That is, the vertical stroke of the beryllium window 16 is exactly the same as the vertical scanning width of the X-ray beam 14 defined by the ±3 milliradian oscillation of the scanning mirror 15 at the beryllium window 16. In addition, the X-ray beam having a wide distribution in the horizontal direction, but only a narrow distribution in the vertical direction, as shown in FIGS. 4A and 4B, matches exactly the 5 mm×50 mm sized beryllium window 16 when penetrating therethrough and, therefore, an X-ray exposure having an area 5 mm×50 mm is always obtained.

According to experiments canducted by the inventors, it was confirmed that the intensity of the X-ray beam transmitted through the beryllium window 16 having a thickness of, for example, 10 μm, was increased 2.5 to 5.0 times, compared to that in a conventionally known X-ray lithography system as mentioned above.

Any known linear motor similar to the linear motor 22 for driving the scanning mirror 15 can be used as the linear motor 33 for driving the beryllium window 16. Also, the drive coils of these two linear motors 22 and 33 can be connected to the controller 34 in a known manner to achieve a synchronous operation of these motors 22 and 33. The bellows poriton 35 also can be consturcted and attached to the end of the vacuum chamber 20 by a known technique. The other portions are the same as in a conventional system and, therefore, the present invention can be realized by a relatively simple modification of a known X-ray lithography system as illustrated in FIG. 3.

We claim:
1. An X-ray lithography system comprising:
means for generating synchrotron beams and separating an X-ray beam therefrom
a vacuum chamber for defining a passage of the X-ray beam;
a scanning mirror arranged in one section of said vacuum chamber for reflecting the X-ray beam;
means for oscillating said scanning mirror so as to scan the reflected X-ray beam in a vertical direction;
a beryllium window defined as a part of said vacuum chamber, through which the X-ray beam is irradiated into an exposure chamber in which is arranged a work piece to be exposed to the X-ray radiation; and,
means for vertically oscillating said beryllium window in such a manner that the beryllium window is shifted up and down in synchronization with the scanning operation of the X-ray beam.

2. A system as set forth in claim 1, wherein said beryllium window is relatively wide in a horizontal direction, but narrow in the vertical direction, and the thickness of said beryllium window is relatively thin.

3. A system as set forth in claim 1, wherein said beryllium window is relatively wide in a horizontal direction, but narrow in the vertical direction and has a size of 50 mm×5 mm, and a relatively thin thickness of, 10 μm.

4. A system as set forth in claim 1, wherein the oscillating means for the mirror and the oscillating means for the window comprise each linear motor separate, said linear motors are connected to a controller.

* * * * *